(12) United States Patent
Wang et al.

(10) Patent No.: US 6,664,185 B1
(45) Date of Patent: Dec. 16, 2003

(54) SELF-ALIGNED BARRIER FORMED WITH AN ALLOY HAVING AT LEAST TWO DOPANT ELEMENTS FOR MINIMIZED RESISTANCE OF INTERCONNECT

(75) Inventors: Pin-Chin C. Wang, Menlo Park, CA (US); Fei Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/132,235

(22) Filed: Apr. 25, 2002

(51) Int. Cl.[7] .............................................. H01L 21/44
(52) U.S. Cl. ...................... 438/659; 438/597; 438/687
(58) Field of Search .................. 438/584, 597, 438/618, 627, 635, 642, 643, 648, 649, 658, 659, 660, 682, 683, 685, 687

(56) References Cited

U.S. PATENT DOCUMENTS 6,037,257 A * 3/2000 Chiang et al. .............. 438/687
6,063,506 A * 5/2000 Andricacos et al. ........ 428/546
6,555,474 B1 * 4/2003 Huang et al. ............... 438/687
6,607,982 B1 * 8/2003 Powell et al. ............... 438/687

* cited by examiner

Primary Examiner—Kamand Cuneo
Assistant Examiner—Scott B. Geyer
(74) Attorney, Agent, or Firm—Monica H. Choi

(57) ABSTRACT

For fabricating an interconnect structure within a dielectric material comprised of at least one dielectric reactant element, an interconnect opening formed within the dielectric material is filled with a conductive fill material comprised of first and second dopant elements that are different. A diffusion barrier material, that surrounds the conductive fill material, is formed from a reaction of the first dopant element and a dielectric reactant element. Also, a boundary material, that surrounds the conductive fill material, is formed from a reaction of the second dopant element and a dielectric reactant element. The boundary material prevents diffusion of a dielectric reactant element from the dielectric material into the conductive fill material.

12 Claims, 4 Drawing Sheets

SELF-ALIGNED BARRIER FORMED WITH AN ALLOY HAVING AT LEAST TWO DOPANT ELEMENTS FOR MINIMIZED RESISTANCE OF INTERCONNECT

TECHNICAL FIELD

The present invention relates generally to fabrication of interconnect structures within integrated circuits, and more particularly, to using an alloy with at least two dopant elements for an interconnect structure for forming the self-aligned diffusion barrier material for minimized resistance of the interconnect structure.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Thus far, aluminum has been prevalently used for metallization within integrated circuits. However, as the width of metal lines are scaled down to smaller submicron and even nanometer dimensions, aluminum metallization shows electromigration failure. Electromigration failure, which may lead to open and extruded metal lines, is now a commonly recognized problem. Moreover, as dimensions of metal lines further decrease, metal line resistance increases substantially, and this increase in line resistance may adversely affect circuit performance.

Given the concerns of electromigration and line resistance with smaller metal lines and vias, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

Referring to FIG. 1, a cross sectional view is shown of a copper interconnect 102 within a trench 104 formed in an insulating layer 106. The copper interconnect 102 within the insulating layer 106 is formed on a dense dielectric material 109 deposited on a semiconductor wafer 108 such as a silicon substrate as part of an integrated circuit. The dense dielectric material 109 may be a hardmask layer, an etch stop layer, or a capping layer comprised of $SiO_2$ (silicon dioxide) or SiN (silicon nitride) for example. Because copper is not a volatile metal, copper cannot be easily etched away in a deposition and etching process as typically used for aluminum metallization. Thus, the copper interconnect 102 is typically formed by etching the trench 104 as an opening within the insulating layer 106, and the trench 104 is then filled with copper typically by an electroplating process, as known to one of ordinary skill in the art of integrated circuit fabrication.

Unfortunately, copper is a mid-bandgap impurity in silicon and silicon dioxide. Thus, copper may diffuse easily into these common integrated circuit materials. Referring to FIG. 1, the insulating layer 106 may be comprised of silicon dioxide or a low dielectric constant insulating material such as organic doped silica, as known to one of ordinary skill in the art of integrated circuit fabrication. The low dielectric constant insulating material has a dielectric constant that is lower than that of pure silicon dioxide ($SiO_2$) for lower capacitance of the interconnect, as known to one of ordinary skill in the art of integrated circuit fabrication.

Copper may easily diffuse into such an insulating layer 106, and this diffusion of copper may degrade the performance of the integrated circuit. Thus, a diffusion barrier material 110 is deposited to surround the copper interconnect 102 within the insulating layer 106 on the sidewalls and the bottom wall of the copper interconnect 102, as known to one of ordinary skill in the art of integrated circuit fabrication. The diffusion barrier material 110 is disposed between the copper interconnect 102 and the insulating layer 106 for preventing diffusion of copper from the copper interconnect 102 to the insulating layer 106 to preserve the integrity of the insulating layer 106.

Further referring to FIG. 1, an encapsulating layer 112 is deposited as a passivation layer to encapsulate the copper interconnect 102, as known to one of ordinary skill in the art of integrated circuit fabrication. The encapsulating layer 112 is typically comprised of a dielectric such as silicon nitride, and copper from the copper interconnect 102 does not easily diffuse into such a dielectric of the encapsulating layer 112.

As the line width of the interconnect structure is continually decreased, the thickness of the diffusion barrier material 110 is desired to be minimized to in turn minimize the volume of the diffusion barrier material 110 within the interconnect opening. Minimizing the volume of the diffusion barrier material 110 in turn maximizes the volume of the copper conductive fill material 102. Generally, diffusion barrier materials have higher resistance than the copper conductive fill material, as known to one of ordinary skill in the art of integrated circuit fabrication. Thus, maximizing the volume of the copper conductive fill material 102 and minimizing the volume of the diffusion barrier material 110 advantageously results in minimizing the resistance of the interconnect structure.

In the prior art, referring to FIG. 2, a conductive fill material 150 such as copper that is doped with a dopant element such as magnesium is formed to fill the interconnect opening 104. Then, a thermal anneal is performed to form a self-aligned diffusion barrier material 152 of FIG. 3. During the thermal anneal process, the magnesium as the dopant element of the copper conductive fill material 150 diffuses out of the copper conductive fill material 150 toward the walls of the interconnect opening 104 to form the self-aligned diffusion barrier material 152 from a reaction of the magnesium with the dielectric material of the insulating layer 106.

For the insulating layer 106 that is comprised of silicon dioxide ($SiO_2$), the magnesium that reaches the walls of the interconnect opening 104 reacts with the oxygen of the silicon dioxide to form the self-aligned diffusion barrier material 152 that is comprised of magnesium oxide (MgO). The thickness of the self-aligned diffusion barrier material 152 that is formed in this manner may be advantageously smaller than a layer of diffusion barrier material that is deposited in a deposition process, as known to one of ordinary skill in the art of integrated circuit fabrication.

However, in the prior art, when oxygen atoms of the silicon dioxide ($SiO_2$) of the insulating layer 106 are consumed to form the self-aligned diffusion barrier material 152, silicon atoms of the silicon dioxide ($SiO_2$) of the insulating layer 106 are free to diffuse into the conductive fill material 150. When such free silicon atoms diffuse from the silicon dioxide ($SiO_2$) of the insulating layer 106 into the conductive fill material 150, the resistance of the conductive fill material 150 increases to disadvantageously form an interconnect structure with higher resistance.

Nevertheless, formation of the self-aligned diffusion barrier material is advantageous for achieving a thinner diffusion barrier material as the dimensions of the interconnect structure are continually scaled down. Thus, a mechanism is desired for forming the self-aligned diffusion barrier material with prevention of the increase of resistance of the conductive fill material.

SUMMARY OF THE INVENTION

Accordingly, in a general aspect of the present invention, a conductive fill material with at least two dopant elements is used. A first dopant element is amenable for forming the self-aligned diffusion barrier material with a first dielectric reactant element of the surrounding insulating layer. In addition, a second dopant element is amenable for forming a boundary material with a remaining second dielectric reactant element of the surrounding insulating layer to prevent diffusion of the second dielectric reactant element into the conductive fill material.

In a general aspect of the present invention, for fabricating an interconnect structure formed within an interconnect opening surrounded by dielectric material, the interconnect opening is filled with a conductive fill material comprised of a bulk conductive fill material doped with a first dopant element and a second dopant element that is different from the first dopant element. The dielectric material is comprised of a first dielectric reactant element and a second dielectric reactant element.

A diffusion barrier material is formed from a reaction of the first dopant element of the conductive fill material and the first dielectric reactant element. The first dopant element of the conductive fill material diffuses out of the conductive fill material to the surrounding dielectric material at walls of the interconnect opening during a thermal anneal process. In addition, a boundary material is formed from a reaction of the second dopant element of the conductive fill material and the second dielectric reactant element. The second dopant element of the conductive fill material diffuses out of the conductive fill material to the surrounding dielectric material at the walls of the interconnect opening during the thermal anneal process.

The diffusion barrier material and the boundary material form a self-aligned skin layer on the walls of the interconnect opening between the conductive fill material and the dielectric material. The self-aligned skin layer prevents diffusion of the conductive fill material into the dielectric material, and the formation of the boundary material prevents diffusion of the second dielectric reactant element into the conductive fill material.

In one embodiment of the present invention, the bulk conductive fill material is copper, and the surrounding insulating dielectric material is comprised of silicon dioxide. When the first dopant element includes at least one of Mg (magnesium), Ca (calcium), Cr (chromium), and Zr (zirconium) and when the first dielectric reactant element is oxygen of silicon dioxide for the dielectric material, then the diffusion barrier material is comprised of a metal oxide. When the second dopant element includes at least one of Ti (titanium), Co (cobalt), Ni (nickel), and Ta (tantalum) and when the second dielectric reactant element is silicon of the silicon dioxide for the dielectric material, then the boundary material is comprised of a metal silicide.

In this manner, the self-aligned skin layer is comprised of the diffusion barrier material and the boundary material formed at the walls of the interconnect opening. Because the skin layer is formed as self-aligned, the thickness of the diffusion barrier material is smaller than those formed with deposition processes. Such a thin diffusion barrier material maximizes the volume of the conductive fill material within the interconnect opening to minimize the resistance of the interconnect structure formed within the interconnect opening. In addition, formation of the boundary material of the skin layer consumes the remaining second dielectric reactant material to prevent diffusion of the second dielectric reactant material into the conductive fill material such that the resistance of the conductive fill material is not increased.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, and 10 refer to elements having similar structure and function.

DETAILED DESCRIPTION

The present invention is described for formation of copper interconnects. However, the present invention may be practiced for minimizing resistance for conductive fill of other types of interconnects, as would be apparent to one of ordinary skill in the art of integrated circuit fabrication from the description herein.

Figure 1:
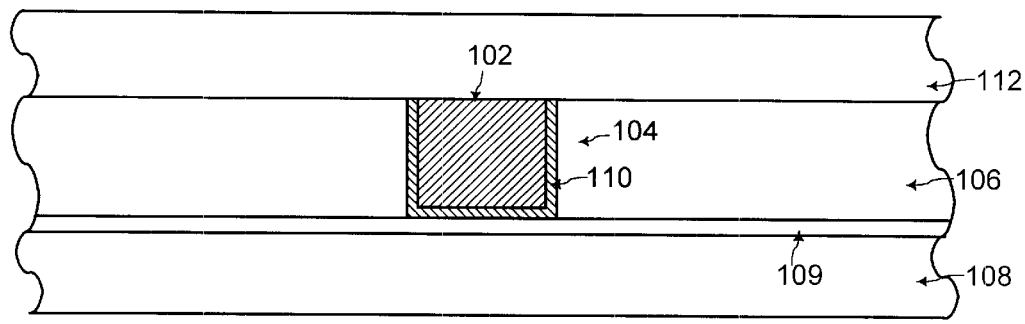
FIG. 1 shows a cross-sectional view of a copper interconnect formed by copper filling a trench within an insulating layer, according to the prior art.
Figure 2:
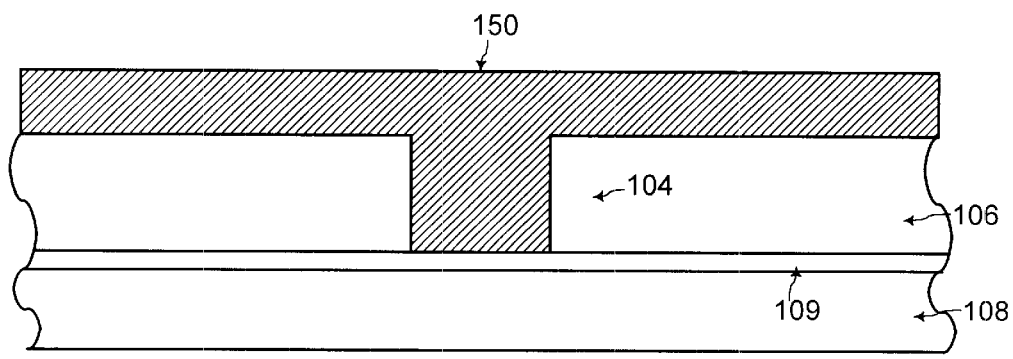
FIG. 2 shows a cross-sectional view illustrating deposition of a copper conductive fill material having a single dopant element for filling an interconnect opening, according to the prior art.
Figure 3:
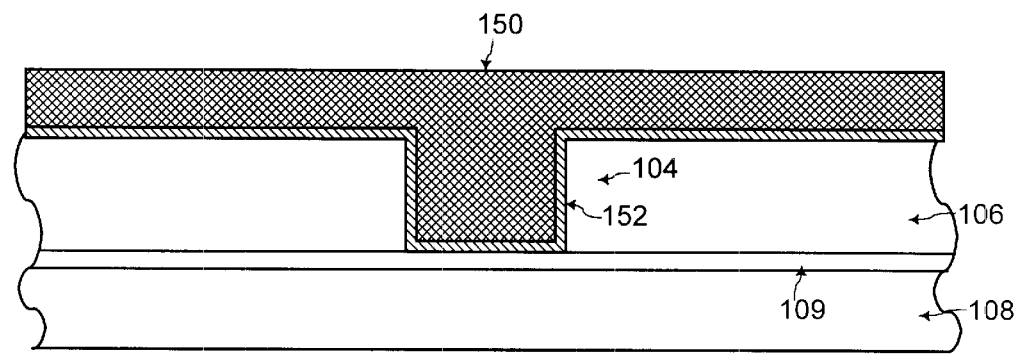
FIG. 3 shows a cross-sectional view of formation of a self-aligned diffusion barrier material from diffusion of the single dopant element for the copper conductive fill material of FIG. 2, according to the prior art.
Figure 4:
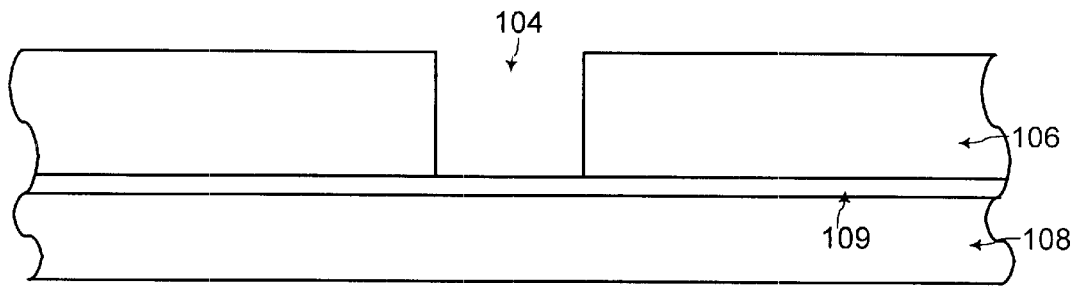
FIGS. 4, 5, 6, and 7 show cross-sectional views for forming an interconnect structure, within an interconnect opening, having a self-aligned skin layer comprised of a diffusion barrier material and a boundary material formed from two dopant elements of a conductive fill material, according to an embodiment of the present invention.

Referring to FIG. 4, the interconnect opening 104 is formed within the insulating layer 106 comprised of dielectric material that may be comprised of silicon dioxide ($SiO_2$), silicon nitride (SiN), or silicon carbide (SiC), for example. In that case, the dielectric material of the insulating layer 106 is comprised of a first dielectric reactant element that is one of oxygen, nitrogen, or carbon, and is comprised of a second dielectric reactant element that is silicon. Processes for patterning and etching such an insulating layer 106 for forming the interconnect opening 104 are known to one of ordinary skill in the art of integrated circuit fabrication.

In addition, the interconnect opening 104 is formed on a layer of dense dielectric material 109 deposited on the semiconductor wafer 108. The dense dielectric material 109 may be a hardmask layer, an etch stop layer, or a capping layer comprised of $SiO_2$ (silicon dioxide) or SiN (silicon nitride) for example.

Figure 5:
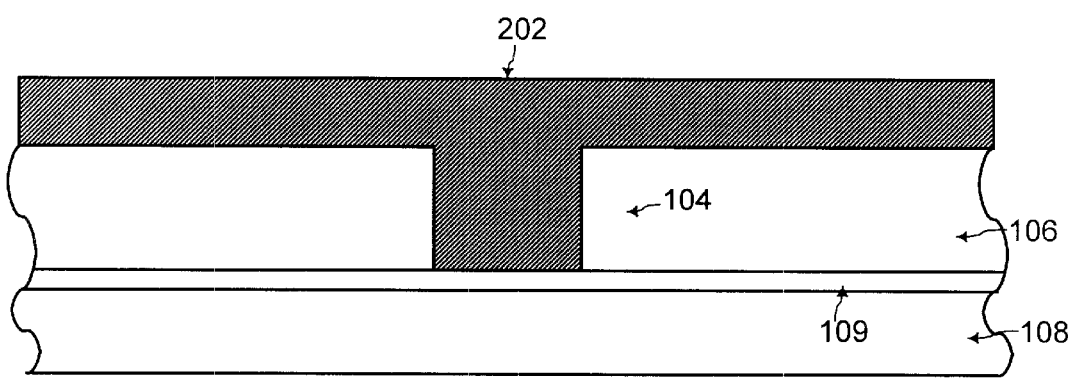

Referring to FIG. 5, a conductive fill material 202 comprised of a bulk conductive fill material doped with at least two dopant elements is deposited to fill the interconnect opening 104. For example, in one embodiment of the present invention, the bulk conductive fill material 202 is comprised of copper that is doped with a first dopant element and a second dopant element. In one embodiment of the present invention, the first dopant element is comprised of at least one of Mg (magnesium), Ca (calcium), Cr (chromium), and Zr (zirconium) for doping the copper, and the second dopant element is comprised of at least one of Ti (titanium), Co (cobalt), Ni (nickel), and Ta (tantalum) for also doping the copper. Processes for deposition of such a conductive fill material 202 doped with the two dopant elements are known to one of ordinary skill in the art of integrated circuit fabrication.

Figure 6:
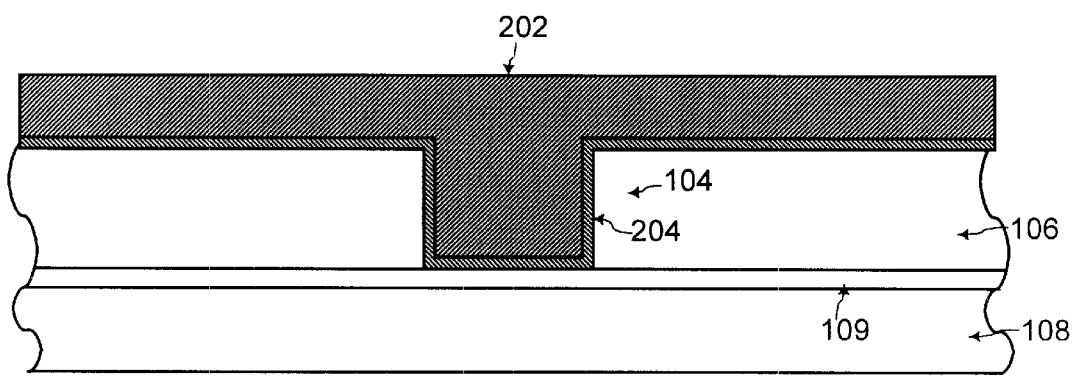

Referring to FIG. 6, a thermal anneal process is performed by heating the semiconductor wafer 108 to a temperature in a range of from about 100° Celsius to about 500° Celsius for a time period in a range of from about 30 seconds to about 2 hours. Thermal anneal processes are known to one of ordinary skill in the art of integrated circuit fabrication. During such a thermal anneal process, a self-aligned skin layer 204 is formed at walls of the interconnect opening 104 from a reaction of the first and second dopant elements from the conductive fill material 202 with the first and second dielectric reactant elements of the insulating layer 106.

During the thermal anneal process, the first and second dopant elements diffuse from the conductive fill material 202 to the walls of the interconnect opening 104 and react with the first and second dielectric reactant elements of the insulating layer 106 at the walls of the interconnect opening 104. For such diffusion of the first and second dopant elements from the conductive fill material 202 to the walls of the interconnect opening 104, the respective concentration of each of the first and second dopant elements within the conductive fill material 202 is controlled to be substantially close to the solid solubility of each of the first and second dopant elements within the bulk conductive material of the conductive fill material 202 before the thermal anneal process. Processes for controlling the concentration of the first and second dopant elements within the conductive fill material 202 during deposition of the conductive fill material 202 are known to one of ordinary skill in the art of integrated circuit fabrication.

The self-aligned skin layer 204 is comprised of a diffusion barrier material formed from the first dopant element that diffuses from the conductive fill material 202 to the walls of the interconnect opening 104 to react with the first dielectric reactant element of the insulating layer 106 at the walls of the interconnect opening 104. In addition, the self-aligned skin layer 204 is also comprised of a boundary material formed from the second dopant element that diffuses from the conductive fill material 202 to the walls of the interconnect opening 104 to react with the second dielectric reactant element of the insulating layer 106 at the walls of the interconnect opening 104.

For example, when the first dopant element is comprised of at least one of Mg (magnesium), Ca (calcium), Cr (chromium), and Zr (zirconium) and the first dielectric reactant element of the insulating layer 106 is one of oxygen, nitrogen, or carbon, the diffusion barrier material of the self-aligned skin layer 204 is comprised of one of a metal oxide, a metal nitride, or a metal carbide, respectively. In addition, when the second dopant element is comprised of at least one of Ti (titanium), Co (cobalt), Ni (nickel), and Ta (tantalum) and the second dielectric reactant element of the insulating layer 106 is silicon, the boundary material of the self-aligned skin layer 204 is comprised of a metal silicide.

In one specific example, when the first dopant element is comprised of Mg (magnesium) and the first dielectric reactant element is oxygen of the insulating layer 106 that is comprised of silicon dioxide ($SiO_2$), the diffusion barrier material of the self-aligned skin layer 204 is magnesium oxide (MgO). In that example, when the second dopant element is comprised of Ni (nickel) and the second dielectric reactant element is silicon of the insulating layer 106 that is comprised of silicon dioxide ($SiO_2$), the boundary material of the self-aligned skin layer 204 is nickel silicide (NiSi).

Figure 7:
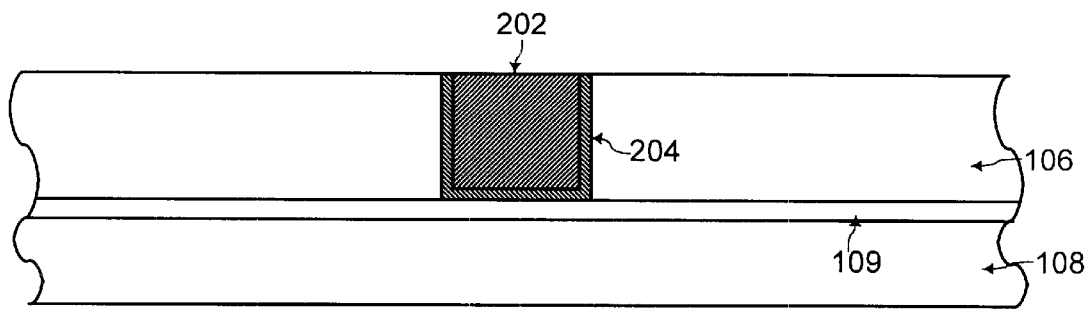

Referring to FIG. 7, the conductive fill material 202 and the skin layer 204 on the insulating layer 106 surrounding the interconnect opening 104 is polished away in a CMP (chemical mechanical polishing) process such that the conductive fill material 202 and the skin layer 204 are contained within the interconnect opening 104 to form the interconnect structure. CMP (chemical mechanical polishing) processes are known to one of ordinary skill in the art of integrated circuit fabrication.

In this manner, the self-aligned skin layer 204 is comprised of the diffusion barrier material and the boundary material formed at the walls of the interconnect opening 104. Thus, the self-aligned skin layer 204 is disposed between the conductive fill material 202 and the insulating layer 106. The diffusion barrier material of the self-aligned skin layer 204 prevent diffusion of the conductive fill material 202 into the surrounding insulating layer 106 (and the bottom layer of dense dielectric material 109).

Because the diffusion barrier material is formed as part of the self-aligned skin layer 204, the thickness of the diffusion barrier material is smaller than those formed with deposition processes. Such a thin diffusion barrier material maximizes the volume of the conductive fill material 202 within the interconnect opening 104 to minimize the resistance of the interconnect structure formed within the interconnect opening 104. In addition, formation of the boundary material of the skin layer 204 consumes the remaining second dielectric reactant material (such as silicon for example) to prevent diffusion of the second dielectric reactant material into the conductive fill material 202 such that the resistance of the conductive fill material 202 is not increased.

Furthermore, in another aspect of the present invention, some portion of the first and second dopant elements remains within the conductive fill material 202 even after the thermal anneal process for forming the self-aligned skin layer 204. When the conductive fill material 202 is comprised of a bulk conductive material that is copper, a copper alloy that is doped has lower resistance than pure copper. Thus, when a portion of the first and second dopant elements remains within the conductive fill material 202 even after the thermal anneal process for forming the self-aligned skin layer 204, the resistance of the conductive fill material 202 is lower than if the conductive fill material 202 were comprised of substantially pure copper. The respective concentration of each of the first and second dopant elements within the conductive fill material 202 before the thermal anneal process is controlled such that a portion of the first and second dopant elements remains within the conductive fill material 202 even after the thermal anneal process for forming the self-aligned skin layer 204. Processes for controlling the concentration of the first and second dopant elements within the conductive fill material 202 during deposition of the conductive fill material 202 are known to one of ordinary skill in the art of integrated circuit fabrication.

Figure 8:
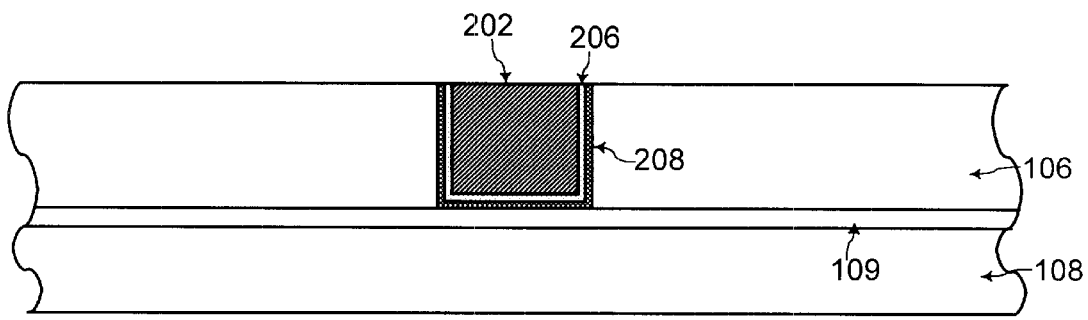
FIG. 8 shows a cross-sectional view of the self-aligned skin layer of FIG. 7 being comprised of a layer of the diffusion barrier material that is separate from a layer of the boundary material, according to another embodiment of the present invention.

In the embodiment of FIGS. 6 and 7, the self-aligned skin layer 204 is comprised of a mixture of the diffusion barrier material and the boundary material. Referring to FIG. 8, in another embodiment of the present invention, the self-aligned skin layer 204 is comprised of a layer of diffusion barrier material 206 that is separate from a layer of boundary material 208. The layer of diffusion barrier material 206 is separate from the layer of boundary material 208 in FIG. 8 when such layers are not soluble in each-other.

In the embodiment of FIG. 8, the layer of diffusion barrier material 206 is formed from the first dopant element that diffuses from the conductive fill material 202 to the walls of the interconnect opening 104 to react with the first dielectric reactant element of the insulating layer 106 at the walls of the interconnect opening 104. In addition, the layer of boundary material 208 is formed from the second dopant element that diffuses from the conductive fill material 202 to the walls of the interconnect opening 104 to react with the second dielectric reactant element of the insulating layer 106 at the walls of the interconnect opening 104. Thus, the interconnect structure formed in the embodiment of FIG. 8 has the self-aligned diffusion barrier material 206 with formation of the boundary material 208 such that resistance of the interconnect structure is minimized.

Figure 9:
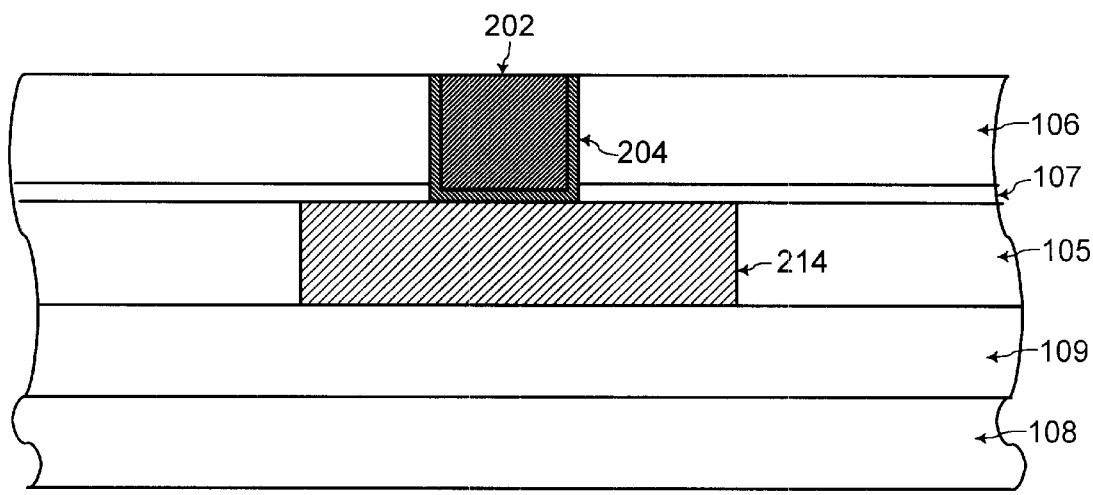
FIG. 9 shows a cross-sectional view illustrating formation of the self-aligned skin layer comprised of the diffusion barrier material and the boundary material at walls of a via hole, according to another embodiment of the present invention.

In FIGS. 7 and 8, the interconnect opening 104 is a trench for a metal line. In another embodiment of the present invention, the interconnect structure of the present invention is formed within an interconnect opening that is a via hole formed over a conductive interconnect structure. Referring to FIG. 9, the interconnect opening is a via hole formed over a conductive interconnect structure 214. The conductive interconnect structure 214 is formed within another layer of dielectric material 105 capped by a hardmask layer 107 and is formed on the dielectric layer 109.

Figure 10:
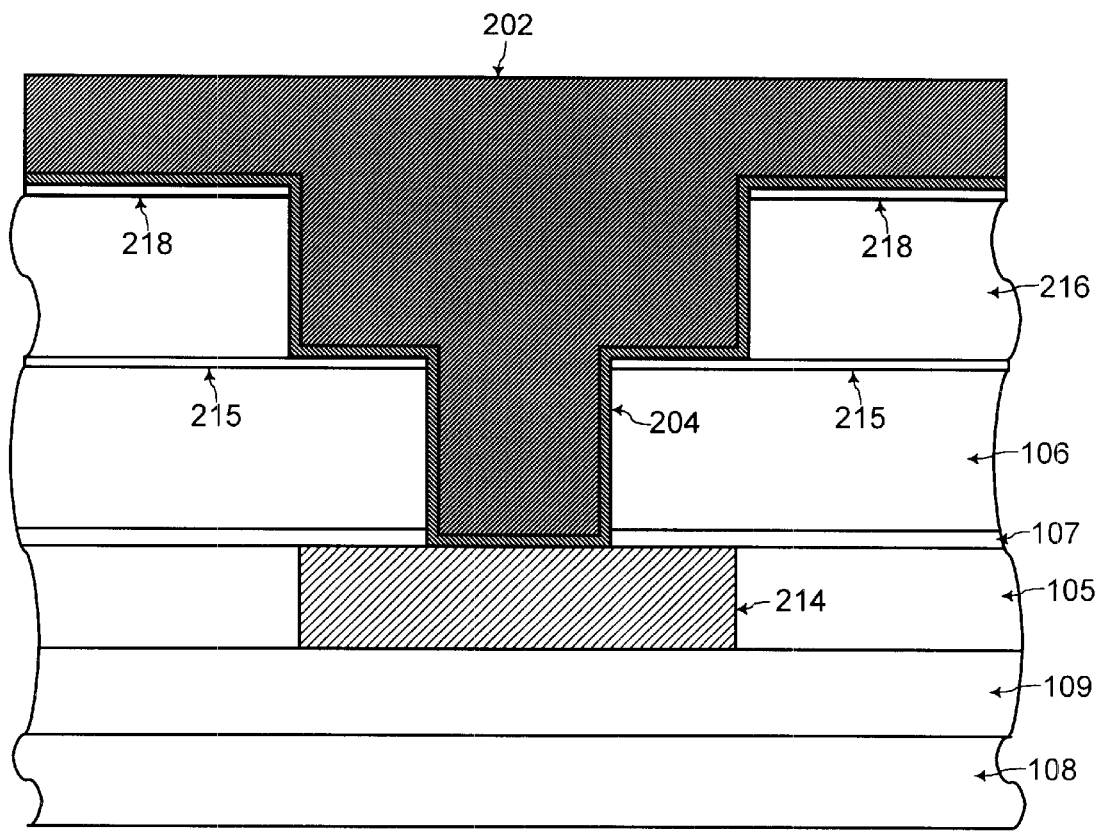
FIG. 10 shows a cross-sectional view illustrating formation of the self-aligned skin layer comprised of the diffusion barrier material and the boundary material at walls of a dual damascene opening, according to another embodiment of the present invention.

Referring to FIG. 10, the interconnect structure of the present invention is formed within an interconnect opening that is a dual damascene opening formed over the conductive interconnect structure 214. In the dual damascene opening of FIG. 10, both a lower opening is formed within the bottom insulating layer 106 with a hardmask layer 215 for forming a via plug to the conductive interconnect structure 214, and an upper opening is formed in an upper insulating layer 216. An additional hardmask layer 218 is formed on the top surface of the upper insulating layer 216 surrounding the interconnect opening. The upper opening formed in the upper insulating layer 216 is for an upper conductive interconnect structure. With the dual damascene opening 116 of FIG. 10, the via structure and the upper conductive interconnect structure are formed substantially simultaneously on the lower conductive interconnect structure 214.

Such a dual damascene opening and such a via hole are known to one of ordinary skill in the art of integrated circuit fabrication. For the via hole of FIG. 9 or the dual damascene opening of FIG. 10, the conductive fill material 202 being doped with the first and second dopant elements is deposited and a thermal anneal process is performed to form the self-aligned skin layer 204 that is similar to the skin layer 204 of FIG. 7 as already described herein.

The foregoing is by way of example only and is not intended to be limiting. For example, the present invention is described for formation of copper interconnect. However, the present invention may be practiced for minimizing electromigration failure and resistance with conductive fill of other types of interconnects, as would be apparent to one of ordinary skill in the art of integrated circuit fabrication from the description herein. In addition, formation of a metal line, a via hole, and a dual damascene opening are illustrated. However, the present invention may be practiced with other types of interconnect openings, as would be apparent to one of ordinary skill in the art of integrated circuit fabrication from the description herein. More specifically, the present invention may be practiced with the metal line, the via hole, and the dual damascene opening formed with different layers of material surrounding such openings, as would be apparent to one of ordinary skill in the art of integrated circuit fabrication from the description herein.

Additionally, as will be understood by those skilled in the art, the structures described herein may be made or used in the same way regardless of their position and orientation. Accordingly, it is to be understood that terms and phrases such as "top," "bottom," and "side" as used herein refer to relative location and orientation of various portions of the structures with respect to one another, and are not intended to suggest that any particular absolute orientation with respect to external objects is necessary or required. The present invention is limited only as defined in the following claims and equivalents thereof.

We claim:

1. A method of fabricating an interconnect structure within a dielectric material comprised of at least one dielectric reactant element, including the steps of:

filling an interconnect opening formed within the dielectric material with a conductive fill material comprised of first and second dopant elements that are different;

forming a diffusion barrier material, that surrounds the conductive fill material, from a reaction of the first dopant element and a dielectric reactant element; and forming a boundary material, that surrounds the conductive fill material, from a reaction of the second dopant element and a dielectric reactant element.

2. The method of claim 1:

wherein the diffusion barrier material prevents diffusion of the conductive fill material into the dielectric material, and wherein the boundary material prevents diffusion of a dielectric reactant element from the dielectric material into the conductive fill material.

3. The method of claim 1, wherein a thermal anneal process is performed for forming the diffusion barrier material and the boundary material.

4. The method of claim 1, wherein the conductive fill material is comprised of a bulk conductive fill material that is copper doped with the first and second dopant elements.

5. The method of claim 1, wherein the first dopant element and the second dopant element are each a respective metal element.

6. The method of claim 5, wherein a dielectric reactant element is one of oxygen, nitrogen, or carbon such that the diffusion barrier material is one of a metal oxide, a metal nitride, or a metal carbide.

7. The method of claim 6, wherein the first dopant element includes at least one of Mg (magnesium), Ca (calcium), Cr (chromium), and Zr (Zirconium).

8. The method of claim 5, wherein a dielectric reactant element is silicon such that the boundary material is a metal silicide.

9. The method of claim 8, wherein the second dopant element includes at least one of Ti (titanium), Co (cobalt), Ni (nickel), and Ta (tantalum).

10. The method of claim 1, wherein a portion of the first and second dopant elements remains within the conductive fill material after formation of the diffusion barrier material and the boundary material.

11. The method of claim 1, wherein the interconnect opening is one of a metal line, a via hole, or a dual damascene opening.

12. A method for fabricating an interconnect structure formed within an interconnect opening surrounded by dielectric material, the method comprising the steps of:
  A. filling the interconnect opening with a conductive fill material comprised of copper doped with a first dopant element and a second dopant element that is different from the first dopant element;
    wherein the first dopant element includes at least one of Mg (magnesium), Ca (calcium), Cr (chromium), and Zr (Zirconium);
    and wherein the second dopant element includes at least one of Ti (titanium), Co (cobalt), Ni (nickel), and Ta (tantalum);
    and wherein the dielectric material is comprised of a first dielectric reactant element and a second dielectric reactant element;
  B. forming a diffusion barrier material from a reaction of the first dopant element of the conductive fill material and the first dielectric reactant element,
    wherein the first dopant element of the conductive fill material diffuses out of the conductive fill material to the surrounding dielectric material at walls of the interconnect opening during a thermal anneal process; and
  C. forming a boundary material from a reaction of the second dopant element of the conductive fill material and the second dielectric reactant element,
    wherein the second dopant element of the conductive fill material diffuses out of the conductive fill material to the surrounding dielectric material at the walls of the interconnect opening during the thermal anneal process;
    and wherein the diffusion barrier material and the boundary material form a self-aligned skin layer on the walls of the interconnect opening between the conductive fill material and the dielectric material;
    and wherein the self-aligned skin layer prevents diffusion of the conductive fill material into the dielectric material;
    and wherein formation of the boundary material prevents diffusion of the second dielectric reactant element into the conductive fill material;
    and wherein the thermal anneal process is performed at a temperature in a range of from about 100° Celsius to about 500° Celsius for a time period in a range of from about 30 seconds to about 2 hours.
    and wherein the first dielectric reactant element is one of oxygen, nitrogen, or carbon such that the diffusion barrier material is one of a metal oxide, a metal nitride, or a metal carbide;
    and wherein the second dielectric reactant element is silicon such that the boundary material is a metal silicide;
    and wherein a portion of the first dopant element remains within the conductive fill material after the thermal anneal process;
    and wherein a portion of the second dopant element remains within the conductive fill material after the thermal anneal process;
    and wherein the interconnect opening is one of a metal line, a via hole, or a dual damascene opening.

* * * * *